United States Patent
Hyun et al.

(10) Patent No.: US 6,423,998 B1
(45) Date of Patent: Jul. 23, 2002

(54) SEMICONDUCTOR DEVICE CAPACITOR AND METHOD OF MANUFACTURING THE SAME

(75) Inventors: Kyung-ho Hyun; Byung-soo Koo, both of Kyungki-do; Wook-sung Son, Seoul; Chang-jip Yang, Kyungki-do, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/323,009

(22) Filed: Jun. 1, 1999

(30) Foreign Application Priority Data

Jun. 9, 1998 (KR) .............................. 98-21371

(51) Int. Cl.[7] ............................................ H01L 27/108
(52) U.S. Cl. ...................................... 257/301; 257/309
(58) Field of Search ................................. 257/303, 301, 257/298, 304, 306, 309; 438/398, 255

(56) References Cited

U.S. PATENT DOCUMENTS

| 5,885,867 A | * 3/1999 | Shin et al. .................. 438/255 |
| 5,937,314 A | 8/1999 | Ping et al. .................. 438/486 |
| 5,959,326 A | * 9/1999 | Aiso et al. .................. 257/306 |
| 5,963,805 A | 10/1999 | Kang et al. .................. 438/255 |

OTHER PUBLICATIONS

Watanabe, H. et al. Hemispherical Grained Si Formation on in-situ Phosphorus Doped Amorphous-Si Electrode for 256Mb DRAM's capacitor. IEEE Transactions on Electron Devices, vol. 42, No. 7, Jul. 1995. pp. 1247–1254.*
H. Watanabe et al. "Hemispherical Grained Silicon (HSG-SI)Formation on In-Situ Phosphorous Doped Amorphous-Si Using the Seeding Method", pp. 422–424.

* cited by examiner

Primary Examiner—Olik Chaudhuri
Assistant Examiner—Ginette Peralta
(74) Attorney, Agent, or Firm—Volentine Francos, PLLC

(57) ABSTRACT

A semiconductor device capacitor has a storage electrode wherein the impurity concentration decreases from the bottom to the top thereof. The semiconductor device capacitor is formed on a lower structure of a semiconductor substrate burying a contact hole formed on the semiconductor substrate. The impurity concentration linearly or non-linearly decreases going upward from the bottom of the contact hole to the top of the storage electrode. A method of manufacturing the semiconductor device capacitor also provides that the storage electrode is formed such that the concentration of impurities decreases linearly or non-linearly going upward from the bottom toward the top.

5 Claims, 6 Drawing Sheets

SEMICONDUCTOR DEVICE CAPACITOR AND METHOD OF MANUFACTURING THE SAME

BACKGROUND OF THE INVENTION

1. Field of the Invention

The present invention relates to a method of manufacturing a semiconductor device capacitor, and more particularly, to a semiconductor device capacitor, and a method of manufacturing the same, wherein the concentration of the impurities inside a storage electrode of the capacitor decreases going upward from the bottom of the contact hole to the top of the storage electrode.

2. Description of the Related Art

The demand for increased integration of semiconductor devices typically requires an increase of the capacitance of a semiconductor device capacitor, and therefore, the structure of the semiconductor device capacitor is becoming more complicated. Among semiconductor memory devices, one unit cell of Dynamic Random Access Memory (DRAM) comprises a single capacitor and a single transistor, and the above-mentioned demand for increased integration of semiconductor devices requires the size of the unit cell be decreased, together with increasing the capacitance of the capacitor.

Therefore, various shapes of semiconductor device capacitors and various method of manufacturing the same have been developed in order to achieve a sufficient capacitance for the capacitor, even though the occupancy area of the capacitor is decreased. For example, a trench capacitor achieves the desired capacitance by digging deep into the inside of the semiconductor substrate. A simple stacked structure, such as a stack capacitor, provides a device structure with a high step-height. Then there are complicated structures such as a fin shape or cylinder shape which increase the surface area of the capacitor and provide a desired capacitance.

In the DRAM device, the memory capacity of the device is proportional to the capacitance of the capacitor, and the capacitance of the capacitor is proportional to the surface area of the storage electrode of the capacitor and the permittivity of the dielectric layer.

Therefore, many attempts and methods have been introduced to increase the capacitance with a highly-integrated semiconductor device, such as techniques for the formation of the storage electrode, the addition of following processes, and the formation of a dielectric layer having high permittivity, etc. For example, 1) a method of depositing a dielectric layer having a high permittivity, such as TiN and $Ta_2O_3$ etc., after etching the polysilicon layer of the storage electrode; 2) a method of increasing the surface area of the capacitor by altering the etch types for the polysilicon layer of the storage electrode, etc.

However, the above methods of increasing the surface area of the capacitor alter the structure of the storage electrode rather than using the characteristics of the material itself as an ingredient of the storage electrode.

In one technique of increasing a capacitor's surface area, an HSG (Hemispherical Grain) layer, its surface being hemispherical-shaped, is formed as a polysilicon layer on the surface of the storage electrode. The size of one grain in the HSG layer is between 500 to 1000 Å. So, the capacitance of the capacitor formed thereby can be increased by a factor of two.

At present, a representative structure for a DRAM device is a Capacitor Over Bit line (COB) structure, wherein a capacitor is formed on the bit line so as to increase the thickness of the storage electrode, and the HSG layer is formed on the storage electrode to increase the capacitance of the capacitor.

The method of manufacturing a semiconductor device capacitor having the COB structure is described below. First, a bit line is formed on a semiconductor substrate to be in communication with the drain region of the transistor, and an insulating material is deposited on the whole surface of the semiconductor substrate to insulate the bit line. Subsequently, the insulating material is partially removed so as to expose some portion of the source region of the transistor. The storage electrode is formed on the insulating material layer, and it is in communication with the source region of the transistor via the exposed portion on the source region.

FIGS. 1 and 2 are cross-sectional views to show the conventional method of forming a semiconductor device capacitor.

As shown in FIG. 1, contact holes 16 are formed on a semiconductor substrate 2 having a specific lower structure comprising insulating layers including a nitride layer 12 and an oxide layer 14, etc. After depositing an amorphous silicon (a-Si) layer on the whole surface of the semiconductor substrate 2, and carrying out a photo etching process, a storage electrode 18 of the capacitor is formed with a desired pattern.

The storage electrode 18 is in communication with the source region 4 of the transistor via the contact holes 16, and stores the information according to the charges transferred from the source region 4. The nitride layer 12 and the oxide layer 14 included in the lower structure of the semiconductor substrate 2 are called an interlayer dielectric layer.

In other words, a lower structure is formed on the semiconductor substrate 2, and contact holes 16 are formed on the contact portion with the source region by means of a typical photo etching process. Then, the storage electrode 18 is formed by depositing amorphous silicon (a-Si) as the material of the storage electrode 18 on the semiconductor substrate including the contact holes 16 by using a Low Pressure Chemical Vapour Deposition (LPCVD) method, and carrying out a photo etching process so as to form a desired pattern of the storage electrode 18.

The amorphous silicon (a-Si) as the storage electrode 18 is deposited by supplying and pyrolyzing silane ($SiH_4$) gas and phosphine ($PH_3$) gas at process temperature ranges of 500 to 530 ° C. Preferably, the amorphous silicon (a-Si) is deposited by means of Low Pressure Chemical Vapour Deposition (LPCVD) method, for its favorable uniformity, impurity, and economic properties. The phosphorus (P) of the phosphine ($PH_3$) gas functions as the impurity of the amorphous silicon (a-Si).

FIG. 2 is a cross-sectional view showing that the dielectric layer 22 and the plate electrode 24 are formed after forming the HSG layer 20 on the storage electrode 18. The formation of an HSG (Hemispherical Grain) layer is discussed, for example, in the reference by Watanabe et al. entitled "*Hemispherical Grained Silicon Formation on In-Situ Phosphorus Doped Amorphous-Si Using The Seeding Method*," (SSDM 1992, pp. 422–424). In particular, a hemispherical grain silicon layer can be formed at the transition temperature range of crystalline silicon and amorphous silicon through silicon migration so that its surface energy is stabilized.

The HSG layer 20 increases the surface area by a factor of as much as two or three. The HSG layer 20 is formed by means of the LPCVD method. First, after maintaining the process chamber at a temperature of 550° C. and at 1 Torr, silicon-containing gas having an active surface reaction such as silane ($SiH_4$) gas or desilane ($Si_2H_6$) gas is supplied so as to create the nucleus formation on the surface of the storage electrode 18. Then, heat-treatment is applied so as to cause a thermal migration of the nucleus. Thus, the HSG layer 20 is formed having a rough surface.

Normally, the grain size of the HSG layer 20 varies depending on the concentration of the phosphorus (P) as an impurity in the amorphous silicon (a-Si) of the storage electrode 18. In other words, the grain size of the HSG layer 20 becomes larger when the concentration of the phosphorus (P) is reduced. However, in decreasing the concentration of the phosphorus (P) in order to increase the grain size of the HSG layer 20, the bulk resistance of the amorphous silicon of the storage electrode is increased, thereby degrading its function as the storage electrode. Further, the interface resistance of the amorphous silicon inside the contact hole 16 and the cell pad 8 is abruptly increased so that the operation speed of the device is decreased.

FIG. 3 is a graphical representation correlating the bulk resistance of the storage electrode to the interface resistance of the storage electrode and the cell pad at various impurity concentration levels.

The X-axis shows the bulk resistance values of the storage electrode 18, and Y-axis shows the interface resistance values of the storage electrode 18 and the cell pad 8. The dark points in the graph mean sample wafers. The circled portion A includes the sample wafers having low bulk resistance values and the circled portion B includes the sample wafers having high bulk resistance values.

Therefore, referring to FIG. 3, the lower the bulk resistance of the storage electrode 18 is, the lower the interface resistance of the storage electrode 18 and the cell pad 8 is.

In the conventional art, there has been no way to produce an HSG layer having large grains while at the same time producing a low value of interface resistance, because the concentration of the impurities inside the storage electrode has been uniformly provided during the formation of the storage electrode.

SUMMARY OF THE INVENTION

The present invention is directed to provide a semiconductor device capacitor and a method of manufacturing the semiconductor device capacitor for increasing the capacitance of the capacitor and increasing the operation speed of the semiconductor device by increasing the grain size of a HSG (Hemispherical Grain) layer, and decreasing the interface resistance between the storage electrode and the lower structure on the semiconductor substrate.

To achieve these and other advantages, a semiconductor device capacitor is provided which comprises a lower structure, including contact holes, formed on a semiconductor substrate; a storage electrode formed on the lower structure burying the contact holes, wherein the concentration of impurities in the storage electrode decreases going upward from the bottom of the contact hole to the top of the storage electrode; an HSG (Hemispherical Grain) layer formed on the storage electrode; a dielectric layer formed on the HSG layer; and a plate electrode formed on the dielectric layer. The concentration of the impurities in the storage electrode, which may be phosphorus (P), linearly or non-linearly decreases going upward.

In another aspect of the present invention, a method of manufacturing a semiconductor device capacitor comprises: a) forming contact holes on the semiconductor substrate, having a lower structure formed thereon; b) forming a storage electrode, wherein the concentration of impurities decreases going upward from the bottom of the contact hole to the top of the storage electrode; c) forming a Hemispherical Grain (HSG) layer on the surface of the storage electrode; d) forming a dielectric layer on the HSG layer; and e) forming a plate electrode on the dielectric layer.

In forming the storage electrode, the concentration of the impurity may linearly decrease going upward. This may be achieved, for example, by decreasing the supplied amount of a gas including the impurity over time.

Alternatively, the storage electrode may be formed such that the concentration of the impurity non-linearly decreases going upward. For example, the storage electrode may be formed to have a lower storage electrode having a first impurity concentration in the contact hole, and an upper storage electrode having a second impurity concentration, which is lower than the first impurity concentration.

It is to be understood that both the foregoing general description and the following detailed description are exemplary and explanatory and are intended to provide further explanation of the invention as claimed. dr

BRIEF DESCRIPTION OF THE DRAWINGS

These and other objects, feature and advantages of the present invention will be described with reference to the accompanying drawings, in which.

DETAILED DESCRIPTION OF PREFERRED EMBODIMENTS

Preferred embodiments of the present invention will now be described in detail with reference to the accompanying drawings.

Figure 10:
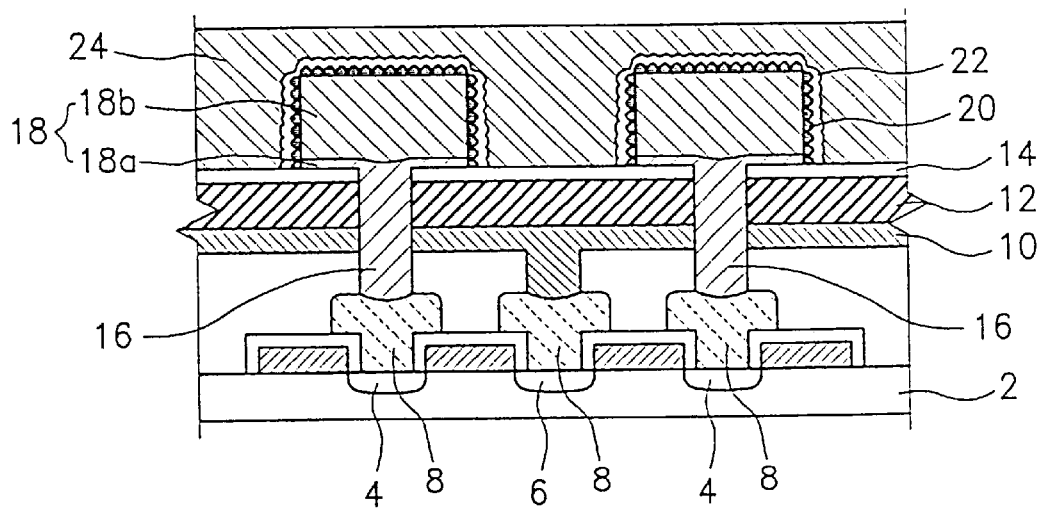

FIG. 10 is a cross-sectional view of a semiconductor device capacitor.

Referring to FIG. 10, the capacitor for a semiconductor device comprises a lower structure including contact holes 16 formed on a semiconductor substrate 2; a storage electrode 18 formed on the lower structure burying the contact holes 16, wherein the concentration of impurities decreases going upward from the bottom of the contact hole 16 to the top of the storage electrode; an HSG (Hemispherical Grain) layer 20 formed on the storage electrode 18; a dielectric layer 22 formed on the HSG layer 20; and a plate electrode 24 formed on the dielectric layer 22.

The structure of the storage electrode 18 of the capacitor can be one or a variety of types of stack-structure, including pin shape or cylinder shape. A cell pad 8 can be formed under the contact hole 16, and the material of the cell pad 8 can be polycrystalline silicon.

The cell pad 8 helps a photo etching process to be carried out more precisely controlling the depth of the contact hole, which becomes deeper with the highly-integrated semiconductor device. In other words, the highly-integrated semiconductor device requires the formation of a more precise pattern. However, the formation of a more precise pattern becomes more difficult because the diameter of the contact hole 16 becomes smaller and its depth becomes deeper in the highly-integrated semiconductor device. Therefore, the profile of the pattern can be improved by forming the cell pad 8 under the contact hole 16 with a certain depth, and thereby forming a contact hole 16 with a shallower depth.

The material of the storage electrode 18 can be amorphous silicon (a-Si) including phosphorus (P) as an impurity. The concentration of impurities in the bottom of the storage electrode 18 affects the interface resistance with the cell pad 8, and the concentration of impurities in the top of the storage electrode 18 affects the grain size of the HSG layer. Therefore, an increase in the concentration of phosphorus (P) in the bottom of the storage electrode 18 decreases the interface resistance of the storage electrode 18 and the cell pad 8. Meanwhile, a decrease in the concentration of phosphorus (P) in the top of the storage electrode 18 increases the grain size of the HSG layer 20 formed on the storage electrode 18, so as to increase the capacitance of the capacitor. Therefore, by increasing the concentration of phosphorus (P) in the bottom of the storage electrode 18, and at the same time decreasing the concentration of phosphorus (P) in the top of the storage electrode 18, we can simultaneously: increase the grain size of the HSG layer 20; prevent an increase of the bulk resistance of the amorphous silicon (a-Si); and prevent an increase of the interface resistance of the storage electrode 18 and the semiconductor substrate 2, or the storage electrode 18 and the cell pad 8 via the contact hole 16. Consequently, the function of the storage electrode 18 can be preserved, and the operating speed of the device can be maintained.

Meanwhile, the impurities inside the storage electrode 18 can be distributed in the storage electrode 18 by non-linearly divided regions of the storage electrode 18, i.e. a region of an upper storage electrode 18a and a region of a lower storage electrode 18b as shown in FIG. 10. Or, the concentration of the impurities can be formed to be linearly decreasing going upward from the bottom of the storage electrode 18 to its top.

Meanwhile, the HSG layer 20 formed on the storage electrode 18 is formed by a method of forming a semiconductor device capacitor which will be described below, and the dielectric layer 22 can be formed as various materials, such as a nitride/oxide (NO) layer or an oxide/nitride/oxide (ONO) layer, etc.

Figure 1:
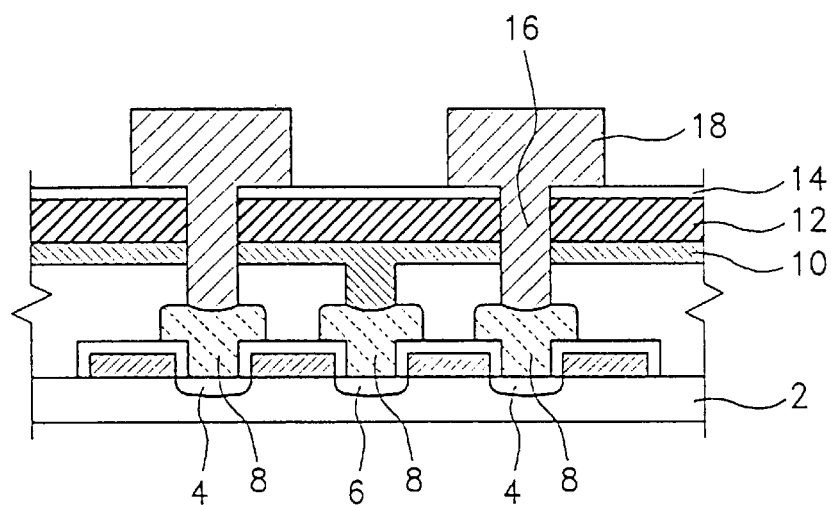
FIGS. 1 and 2 are cross-sectional views to show a conventional method of forming a semiconductor device capacitor.
Figure 2:
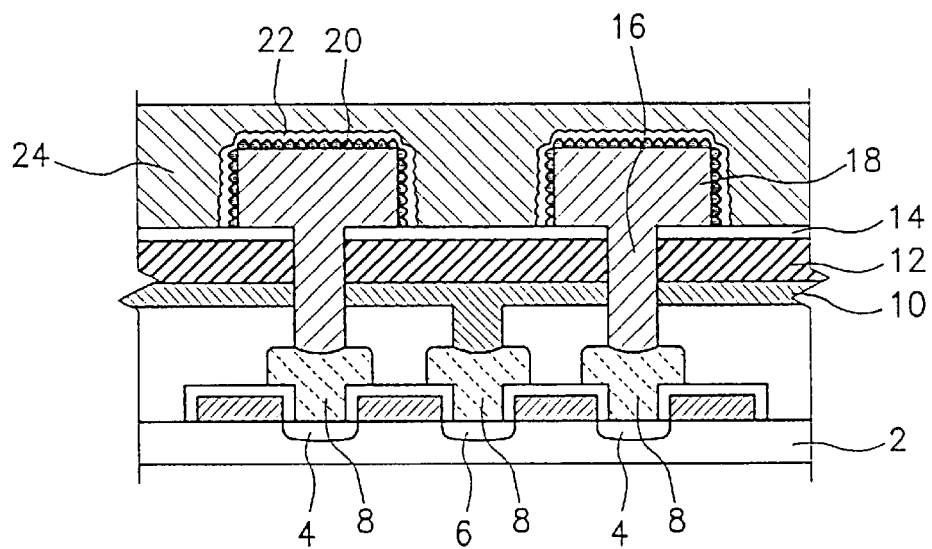
Figure 3:
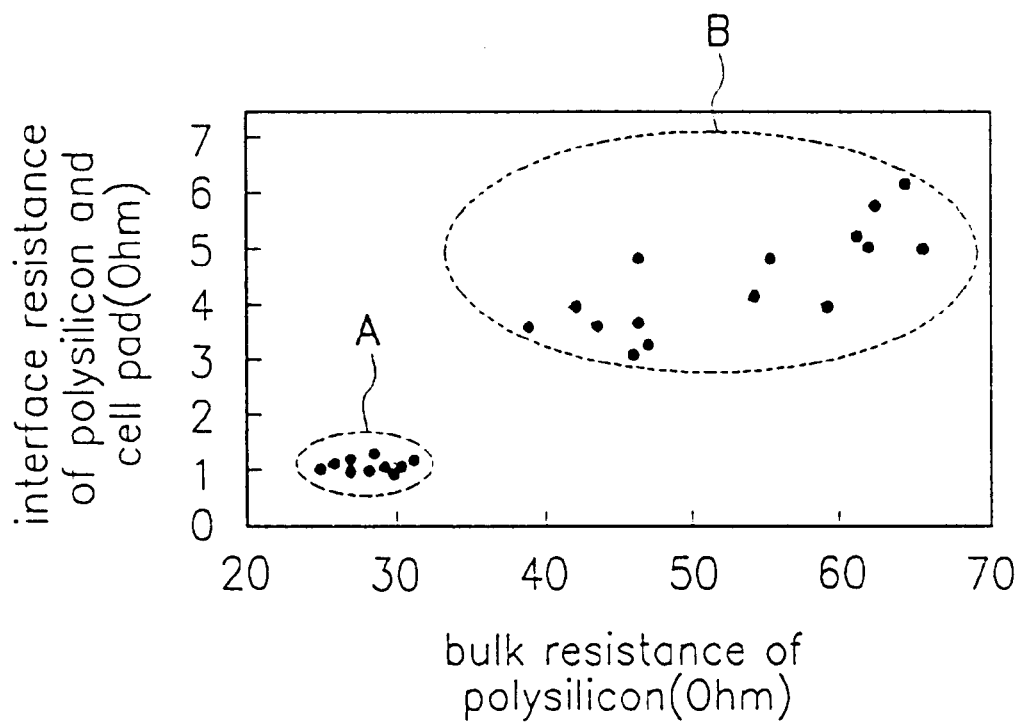
FIG. 3 is a graphical representation correlating the bulk resistance of a storage electrode to the interface resistance of the storage electrode and a cell pad at various impurity concentration levels.
Figure 4:
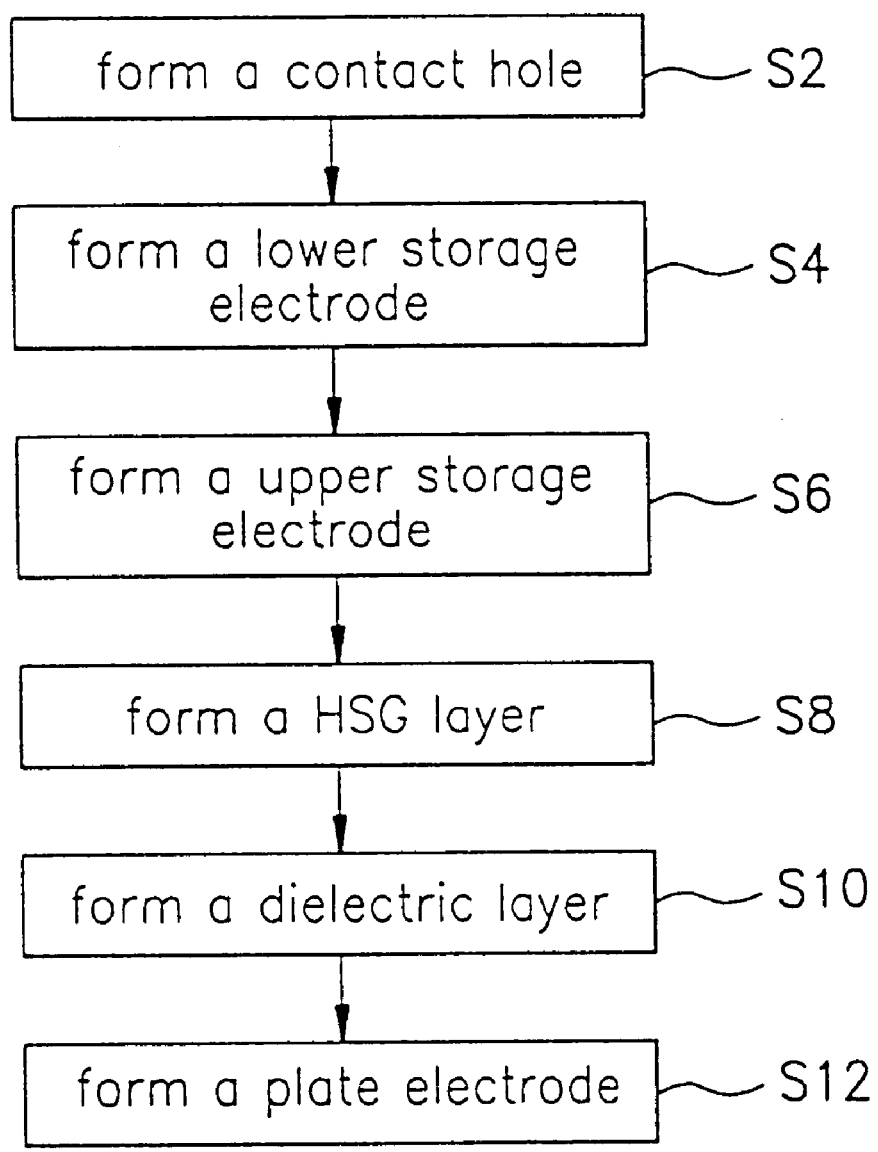
FIG. 4 shows processing sequences of a method of forming a semiconductor device capacitor according to one or more aspects of the present invention.

FIG. 4 shows processing sequences of a method of forming a semiconductor device capacitor.

As shown in FIG. 4, an S2 step is executed so as to form contact holes on a semiconductor substrate having a lower structure already formed thereon. That is, after forming an insulating layer on the whole surface of the semiconductor substrate having a cell pad contacting with a source region of a transistor, and having a bit line contacting with a drain region of the transistor, contact holes are formed by a photo etching process in order to expose some portion of the cell pad. With the highly-integrated semiconductor device, the pattern profile of the contact holes needs to be improved. Therefore, a cell pad is formed under the contact hole to control the actual height of the contact hole.

Then, as a step of forming a storage electrode on the semiconductor substrate, after depositing an amorphous silicon (a-Si) layer on the semiconductor substrate, a photo etching process is executed so as to form a storage electrode.

The formation of the storage electrode can be carried out by two steps, divided into an S4 step of forming a lower storage electrode and an S6 step of forming a upper storage electrode, differing according to the concentration of the impurities included in the amorphous silicon (a-Si) layer. The S4 step forms a lower storage electrode having a first impurity concentration in the contact hole. The S6 step forms an upper storage electrode having a second impurity concentration on the lower storage electrode, the second impurity concentration being less than the first impurity concentration. Therefore, the grain of the HSG layer formed on the upper storage electrode can be formed larger than on the conventional storage electrode having an uniform impurity concentration. Preferably, the lower storage electrode may fill only the area inside the contact hole sufficient to achieve a desired decrease the interface resistance with the cell pad.

After forming the lower storage electrode, nitrogen ($N_2$) gas as an inert gas is made to be flowed into the process chamber before forming the upper storage electrode to stabilize the pressure inside the process chamber, because the process normally becomes destabilized due to the decrease of the flow amount of the process gas inside the process chamber under the same pressure conditions during the changes of the process from the formation of the lower storage electrode to the formation of the upper storage electrode.

Subsequently, as an S8 step of forming a HSG layer on the upper storage electrode, the HSG layer having a rough surface is formed on the upper storage electrode to increase the capacitance of the capacitor.

Then, an S10 step is executed so as to form a dielectric layer on the HSG layer. Any typical dielectric layer can be employed; the process is not limited to any specific one. For example, a nitride/oxide (N/O) layer, or an oxide/nitride/oxide (O/N/O) layer, can be deposited.

Then, an S12 step is executed so as to form a plate electrode on the dielectric layer by depositing polysilicon on the dielectric layer, completing the formation of a capacitor.

FIGS. 5 to 10 are cross-sectional views which illustrate a method of forming a semiconductor device capacitor.

Figure 5:
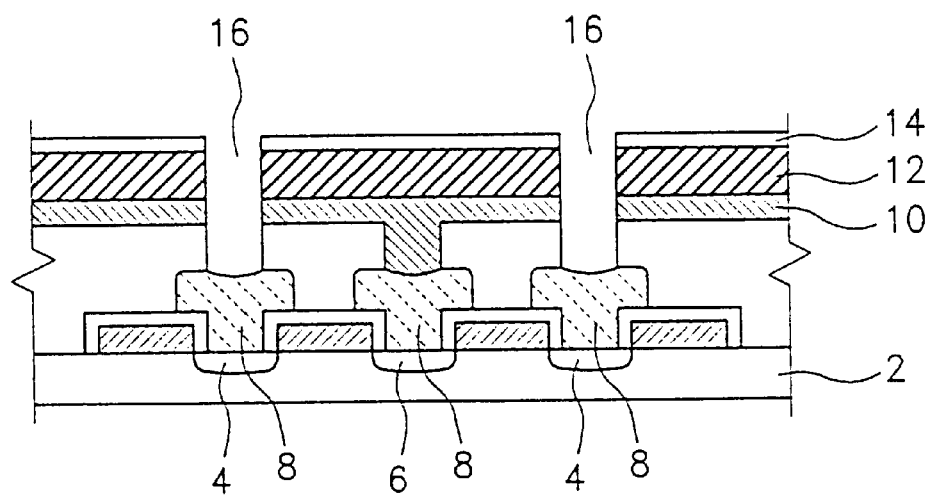
FIGS. 5 to 10 are cross-sectional views to illustrate a method of forming a semiconductor device capacitor according to one or more aspects of the present invention.

FIG. 5 is a cross section showing that one or more contact holes 16 are formed on a semiconductor substrate 2 having a lower structure formed thereon, which is made by forming an insulating layer 12 and an oxide layer 14 on the whole surface of the semiconductor substrate 2 having cell pads 8 contacting with a source region 4 and a drain region 6 of a transistor, and a bit line 10 contacting with the drain region 6. The contact holes 16 are formed by coating photoresist on the semiconductor substrate 2, forming a photoresist pattern by means of an exposure process and a development process, and carrying out an etching process in order to expose a part of the cell pad 8 to form the contact hole 16.

The cell pad 8 is formed to control the actual depth of the contact hole 16 because it is becoming more difficult to get a desired pattern profile with the increasing depth of the contact hole 16.

Figure 6:
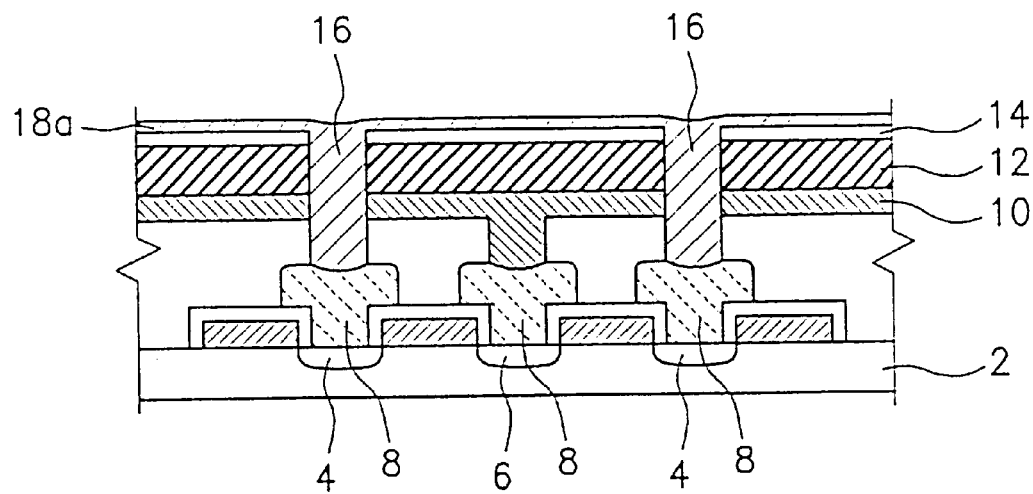

FIG. 6 is a cross-section showing that the lower storage electrode 18a is formed on the contact hole 16. The lower storage electrode 18a is in communication with the source region 4 via the contact hole 16, and stores information according to the charges transferred from the source region 4 as well as the upper storage electrode 18b, which will be formed in the following process. The lower storage electrode 18a is formed by supplying a process gas comprising a mixture of a gas including silicon (Si) and a gas including phosphorus (P) so as to pyrolyze it, and burying the contact hole 16 with an amorphous silicon (a-Si) having phosphorus (p) as an impurity, by means of Low Pressure Chemical Vapour Deposition (LPCVD) method.

The gas including silicon (Si) is preferably silane ($SiH_4$) gas or desilane ($Si_2H_6$) gas, and the gas including phosphorus (P) is preferably phosphine ($PH_3$) gas. The concentration of the phosphine ($PH_3$) gas is preferably 0.1%, and preferably, a nitrogen ($N_2$) gas is used as a carrier gas.

Specifically, using the LPCVD method, the desilane ($Si_2H_6$) gas is flowed into the process chamber at 400 to 600 sccm and the phosphine ($PH_3$) gas is flowed preferably at 200 to 300 sccm at a temperature of 500 to 530° C., and the gas is pyrolyzed and deposited, burying the contact hole 16.

The formation of the lower storage electrode 18a preferably fills the contact hole 16 completely, to achieve a desired decrease in the interface resistance with the cell pad 8.

Therefore, the thickness of the lower storage electrode 18a formed on the contact hole 16 can be varied depending on the diameter and the depth of the contact hole 16 according to the structure of the semiconductor device.

Figure 7:
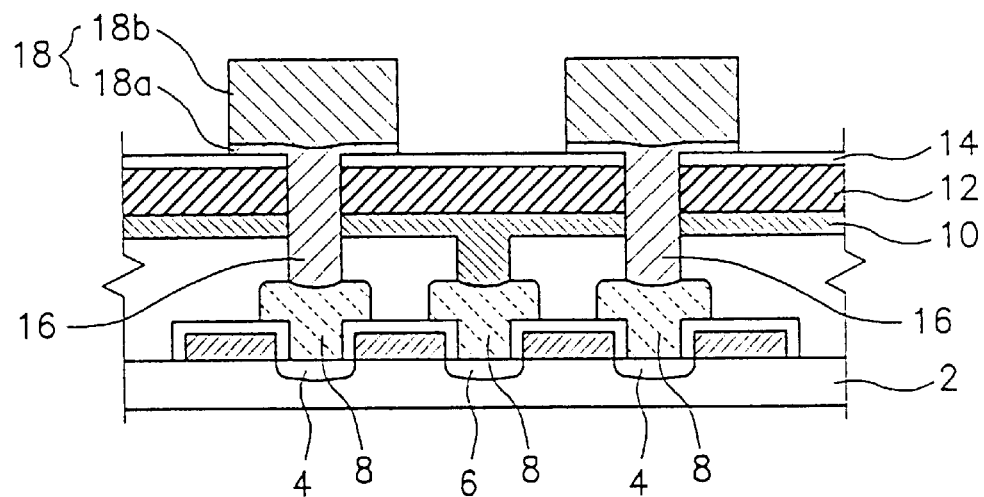

FIG. 7 is a cross-section showing a storage electrode 18 formed via a photo etching process after depositing a upper storage electrode 18b on the lower storage electrode 18a.

The upper storage electrode 18b is formed by flowing desilane ($Si_2H_6$) gas into the process chamber at 400 to 600 sccm and the phosphine ($PH_3$) gas preferably at 100 to 150 sccm at a process temperature of 500 to 530° C., pyrolyzing the gas, and depositing it, burying the contact hole.

At this point, it should be noted that the pressure difference in the process chamber after depositing the lower storage electrode 18a normally causes process failure, which occurs because of a difference in flow amount of the phosphine ($PH_3$) gas supplied during the deposition for the upper storage electrode 18b under the same pressure condition. Therefore, before the deposition for the upper storage electrode 18b, nitrogen ($N_2$) gas is flowed into the process chamber at a flow amount identical to the flow amount of the phosphine ($PH_3$) gas to stabilize the process chamber, and then, the upper storage electrode 18b is formed.

The concentration of phosphorus (P) is higher in the lower storage electrode 18a than in the upper storage electrode 18b, and to this end, the flow amount of the phosphine ($PH_3$) gas is greater during the formation of the lower storage electrode 18a than during the formation of the upper storage electrode 18b.

Therefore, as described above, problems of the conventional art such as the high interface resistance between the lower storage electrode 18a and the cell pad 8 and the bulk resistance of the lower storage electrode 18a itself can be solved by making the concentration of the phosphorus (P) higher in the lower storage electrode 18a than in the upper storage electrode 18b. In addition, the decreased concentration of the phosphorus (P) in the upper storage electrode 18b makes it possible to make the grain size of the HSG layer which will be formed in the following process bigger than in the conventional art.

Figure 8:
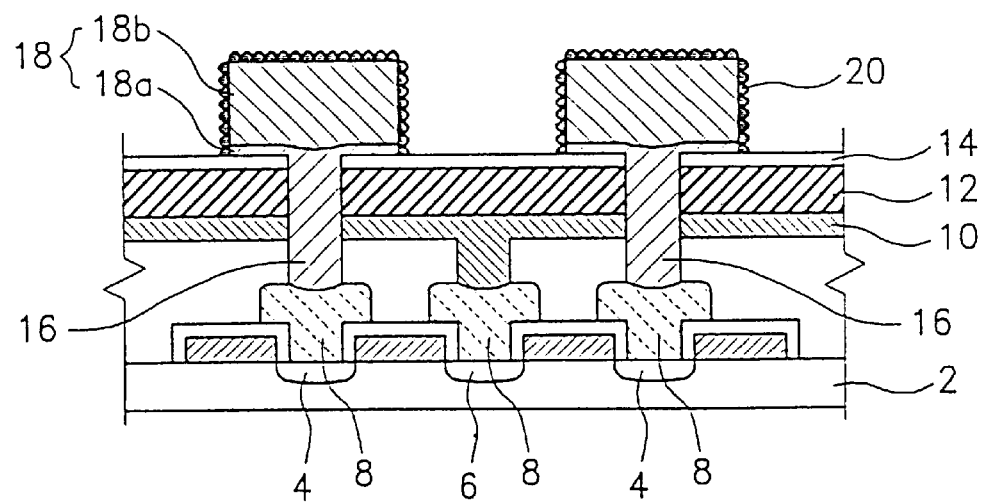

FIG. 8 is a cross-section showing that the HSG layer 20 is formed on the upper storage electrode 18b.

The formation of the HSG layer 20 uses the silicon migration at the transition temperature ranges from amorphous silicon (a-Si) to polysilicon (p-Si) by which a hemispherical shape is formed, its surface energy being most stabilized. The HSG layer 20 has a surface area two to three times as large as that of a flat surface.

The HSG layer 20 is formed by means of the LPCVD method. First, after maintaining the process chamber at a temperature of 550° C. and at 1 Torr, silicon-containing gas having an active surface reaction, such as silane ($SiH_4$) gas or desilane ($Si_2H_6$) gas is supplied, so as to create the nucleus formation on the surface of the storage electrode 18. Then, heat-treatment is applied so as to cause the thermal migration of the nucleus. Thereby the HSG layer 20 is formed having a rough surface.

Figure 9:
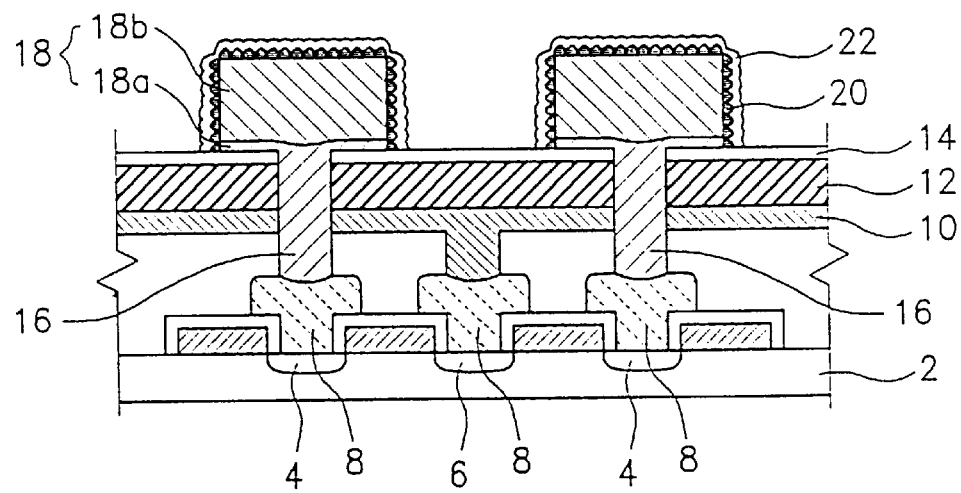

FIG. 9 is a cross-section showing that a dielectric layer 22 is formed on the HSG layer 20.

A nitride layer is formed on the HSG layer 20 using desilane ($Si_2H_6$) gas and ammonia ($NH_3$) gas by a conventional method of layer formation, and then, by oxidizing the nitride layer surface, a nitride/oxide (NO) dielectric layer is formed. The dielectric layer 22 is not limited to this; any typical dielectric layer can be formed.

FIG. 10 is a cross-section showing that a plate electrode 24 is formed on the dielectric layer 22. By depositing a polysilicon layer on the dielectric layer 22, the plate electrode 24 is formed, thereby completing the capacitor.

As described above, the formation process of the storage electrode 18 is divided into two steps producing different impurity concentrations. The concentration of phosphorus (P) in the lower storage electrode 18a is greater, to decrease the interface resistance of the lower storage electrode 18a and the cell pad 8. The concentration of phosphorus (P) in the upper storage electrode 18b is lower, to increase the grain size of the HSG layer 20 formed on the upper storage electrode 18b, which increases the capacitance of the capacitor.

While, in the embodiment described above, the storage electrode has been made with two regions each having different concentration of impurities, it can also be made with multiple regions. Further, in the embodiment described above, the change in concentration of impurities from the lower storage electrode, to the upper storage electrode region is non-linear. However, the concentration of impurities can be linearly formed going upward from the bottom of the electrode to its upper portions. The material in the respective elements of the capacitor employed in the present invention or the species of the impurities can be selected variously within the scope and spirit of the present invention. Thus, by increasing the grain size for the HSG layer, the present invention provides a capacitor having a high capacitance and, by decreasing the interface resistance and the bulk resistance, a device having a fast operation speed.

Additional advantages and modifications will readily occur to those skilled in the art. Therefore, the invention in its broader aspects is not limited to the specific details, and representative terms, shown and described therein. Accordingly, various modifications may be made without departing from the spirit or scope of the general inventive concept as defined by the appended claims and their equivalents.

What is claimed is:

1. A semiconductor device capacitor comprising:
    a lower structure formed on a principal surface of a semiconductor substrate, said lower structure including a contact hole formed therein;
    a storage electrode formed on the lower structure and burying the contact hole, the storage electrode comprising,
        a lower portion filling the contact hole and having a first thickness extending above the lower structure, and
        an upper portion having a second thickness extending above the lower portion, where the second thickness is substantially greater than the first thickness, wherein the lower portion has a first concentration of a conductivity-enhancing impurity and the upper portion has a second concentration of the conductivity-enhancing impurity, the second concentration being less than the first concentration;

an HSG (Hemispherical Grain) layer formed on the upper portion of the storage electrode having the second concentration of the conductivity-enhancing impurity so as to have a stabilized surface energy;

a dielectric layer formed on the HSG layer; and a plate electrode formed on the dielectric layer.

2. A semiconductor device capacitor comprising:

a lower structure formed on a principal surface of a semiconductor substrate, said lower structure including a contact hole formed therein, said contact hole including a bottom and a top thereof;

a storage electrode formed on the lower structure and burying the contact hole, the storage electrode comprising,
  a lower storage electrode portion filling the contact hole, and
  an upper storage electrode portion formed on the lower portion, wherein the lower portion has a first concentration of a conductivity-enhancing impurity and the upper portion has a second concentration of the conductivity-enhancing impurity, the second concentration being less than the first concentration;

an HSG (Hemispherical Grain) layer formed on the storage electrode;

a dielectric layer formed on the HSG layer; and a plate electrode formed on the dielectric layer.

3. The semiconductor device capacitor of claim 1, wherein the dielectric layer is one selected from a group consisting of a nitride/oxide (N/O) layer and an oxide/nitride/oxide (O/N/O) layer.

4. The semiconductor device capacitor of claim 1, wherein a cell pad is further formed on the principal surface of the semiconductor substrate under the contact hole.

5. The semiconductor device capacitor of claim 1, wherein the impurity in the storage electrode is phosphorus (P).

* * * * *